United States Patent [19]
Pfaff

[11] Patent Number: 5,508,628
[45] Date of Patent: Apr. 16, 1996

[54] AUTOMATED CLOSURE TEST SOCKET

[76] Inventor: Wayne K. Pfaff, 309 Steeplechase, Irving, Tex. 75062

[21] Appl. No.: 382,488

[22] Filed: Feb. 1, 1995

[51] Int. Cl.[6] .............................. G01R 1/04; H01R 11/22
[52] U.S. Cl. .................. 324/755; 439/266; 439/71; 439/912; 439/54; 439/83; 439/260; 439/263; 29/593; 29/832; 29/847; 29/848; 29/849; 29/850
[58] Field of Search ........................... 324/755; 439/266, 439/71, 912, 54, 68, 69, 70, 71, 83, 263, 264; 29/593, 832, 847, 848, 849, 850

[56] References Cited

U.S. PATENT DOCUMENTS 5,419,710  5/1995  Pfaff ................................. 439/266

Primary Examiner—Kenneth A. Wieder
Assistant Examiner—Barry C. Bowser
Attorney, Agent, or Firm—Jack A. Kanz

[57] ABSTRACT

A pivoting beam or lever is used to open and close burn-in and test sockets which employ laterally moving cammed plates to form electrical contact between electrical contact fingers within the socket and terminals depending from an electronic device package. The pivoting beam is oriented and adapted for operation by vertically applied forces so that opening and closing the socket is easily automatible using the pick and place equipment conventionally used to insert and remove electronic device packages from open top sockets.

8 Claims, 4 Drawing Sheets

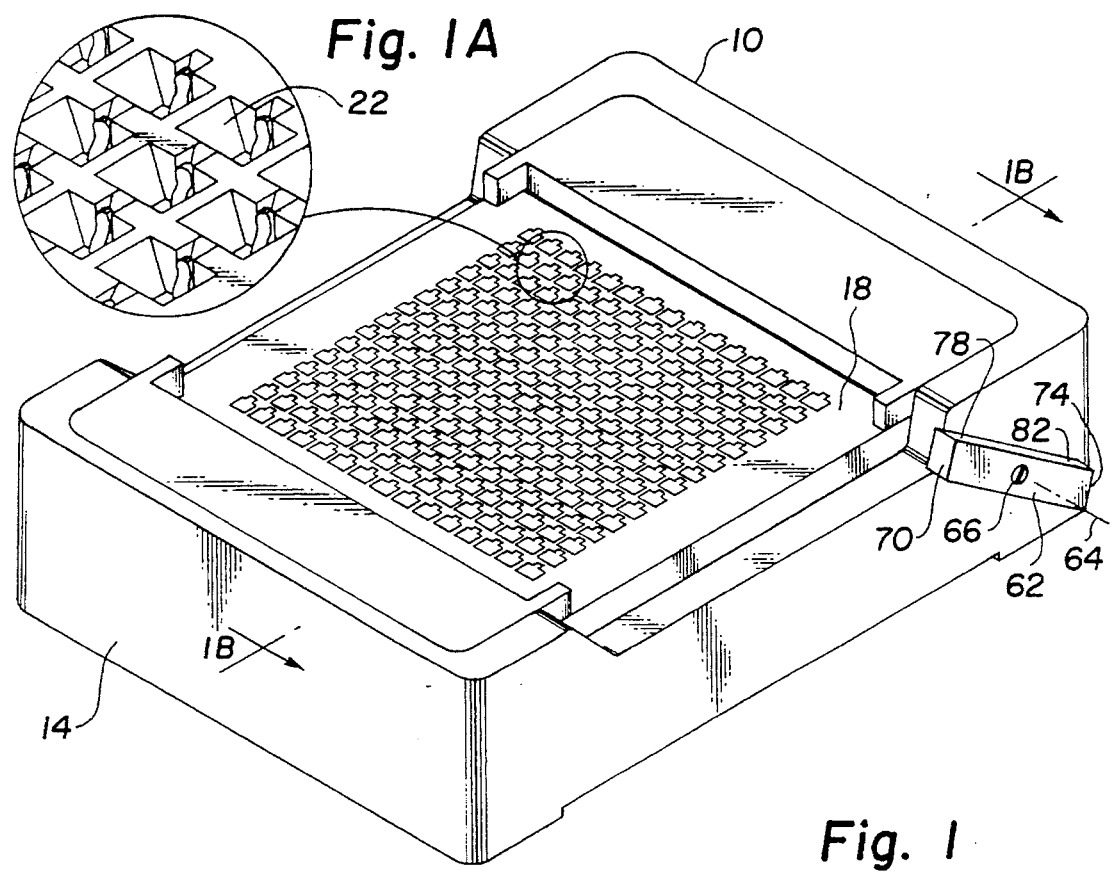
Fig. 1A
Fig. 1
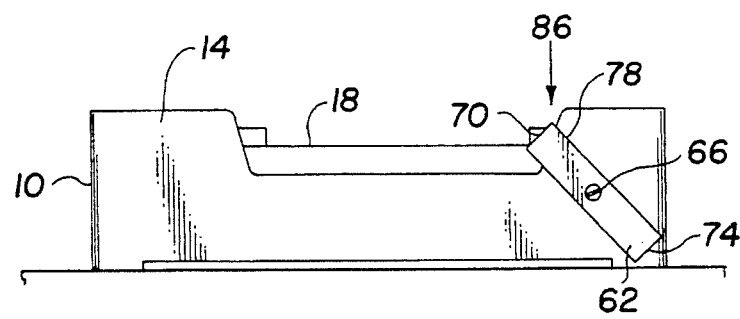
Fig. 2A
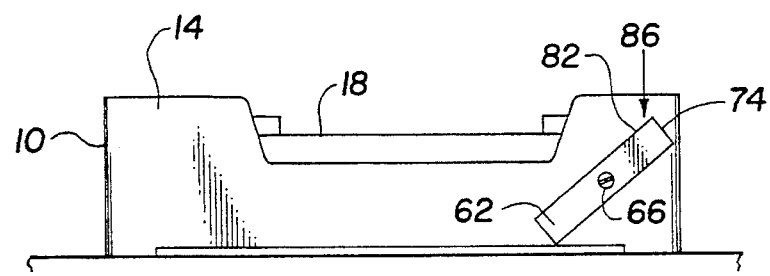
Fig. 2B

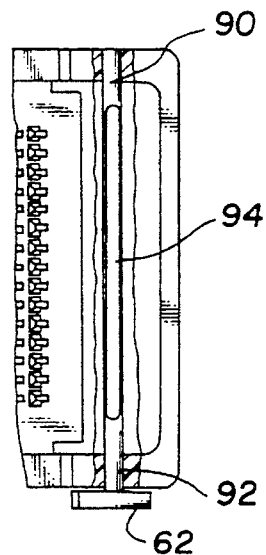
Fig. 3
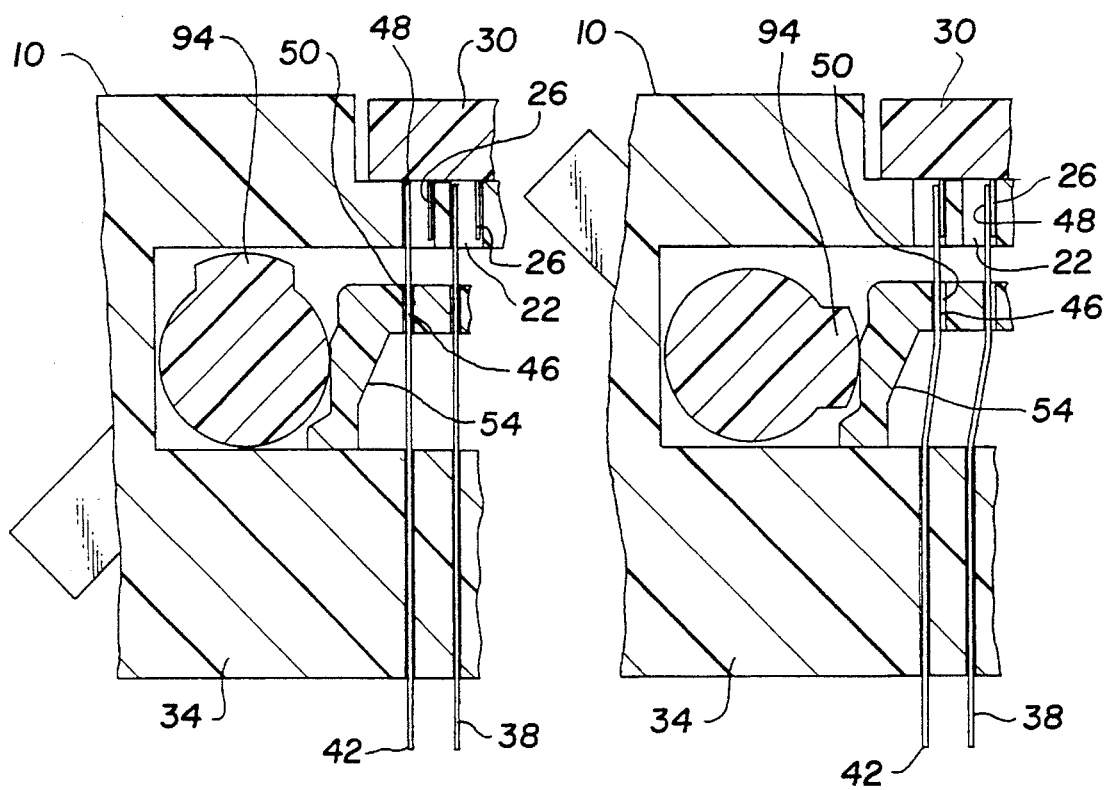
Fig. 1B
Fig. 1C

AUTOMATED CLOSURE TEST SOCKET

This invention relates to burn-in and test sockets for electronic device packages. More particularly, it relates to apparatus for opening and closing test sockets which use the lateral movement of a cam plate or the like to establish electrical contact between downwardly-depending terminals of an electronic device package and electrical contact fingers in the socket.

BACKGROUND OF THE INVENTION

Many electronic devices are subjected to burn-in and/or test procedures at some point during or after the fabrication process. For burn-in and test, the packages containing the electronic device must be removeably mounted on or in a test fixture or socket which provides electrical connection with each of the package input/output terminals while the device is functionally tested and evaluated. In many cases the device package is subjected to harsh environmental conditions (such as heat, etc.) as well as electrical stresses to evaluate and assure full functionality of the finished device. In order to provide effective testing and burn-in, the fixture in which the device package is mounted for testing and burn-in must permit rapid and easy insertion and removal without damage to the electronic device, the device package or the device package input/output terminals. The socket must also withstand repeated use without failure or diminished reliability.

A variety of zero insertion force test sockets have evolved in response to this need. Most are designed so that a device package may be mounted using vacuum pencils and the like as employed in automated pick and place systems. Electrical contact fingers within the various sockets provide electrical connections with the device package terminals and grip the terminals to retain the device packages within the socket. Since the contact fingers physically retain the device package, means must be provided for opening and closing the contact fingers to facilitate insertion and removal of the device package. Since an opening and closing cycle must occur for each package tested, automation of these steps is highly desireable.

Typical device package test sockets, such as disclosed in U.S. Pat. No. 4,491,377, respond to a vertical force which activates a spreader to spread the ends of electrical contact fingers within the socket. When the ends of the contact fingers are spread, the device package is inserted into the socket through a top opening. After the device package is in place, the vertical force is removed and the spreader retreats, allowing the contact fingers to close against and grip the terminals on the device package. Since the device packages are inserted from the top, insertion may be performed by gravity and/or with automated pick and place systems. Since the pick and place machinery basically moves in the vertical direction, it is a simple matter to apply a vertical force to the spreader to open and close the contact fingers. This arrangement, however, is not well adapted to mounting device packages utilizing ball grid array, pin grid array or other terminal configurations which require the contact fingers to all move simultaneously in the same direction toward and away from the device package terminals transversely to the direction of loading and unloading.

Sockets as disclosed in U.S. Pat. No. 4,950,980 are intended to accommodate device packages with downwardly projecting leads or terminals. The device package rests on a moveable cam plate. After the device package is inserted into the socket, the plate is activated (via cam means) to move in a lateral direction. The lateral movement repositions the device package so that its leads or terminals are brought into contact with the contact fingers of the socket. The cam is operated by a lever which moves laterally. By moving only in the lateral direction, however, the lever may not be automated using the vertical movement of the pick and place equipment used to deposit the device packages in the sockets.

Another socket which utilizes a laterally moving cam plate is disclosed in application for United States Letters Patent entitled Mounting Apparatus for Ball Grid Array Device filed Jun. 10, 1994, under Ser. No. 08/258,348. This socket is designed to accommodate a device package with ball grid array terminals projecting downwardly into apertures in a support plate. While the device package is held stationary, a cam activates an underlying cam plate which moves the contact fingers toward the terminals of the ball grid array. The cam is operated by a lever which is not amenable to activation by the vertical movement of conventional automated operations using pick and place equipment.

SUMMARY OF THE INVENTION

In accordance with the present invention a test socket having a plurality of resilient contact fingers is provided with opening and closing apparatus employing a pivoting beam operable by application of vertical forces only. Thus the socket may be opened (and held open) or closed by timely application of vertical force to the appropriate end portion of the pivoting beam. The preferred apparatus employs a cam shaft rotating in conjunction with the beam to cause lateral movement of a cam plate or the like. Lateral movement of the cam plate biases the contact fingers into the terminals depending from the face of an electronic device package (or moves the device package into contact with the contact fingers) and vice versa.

A pivoting beam is positioned on the cam shaft and oriented to be operated by application of vertical force to either end portion thereof. Thus opening and closing of the socket can be automated and coordinated with conventional vertically-moving pick and place equipment used to place an electronic device package in top-loading sockets. Other features and advantages of the invention will become more readily understood from the following detailed description taken in conjunction with the appended claims and attached drawing wherein:

BRIEF DESCRIPTION OF THE DRAWING

FIG. 1 is a perspective view of burn-in socket apparatus employing the pivoting arm of the invention;

FIG. 1A is an enlarged fragmentary view of the top surface of the apparatus of FIG. 1;

Fig. 1B is a fragmentary sectional view of the apparatus of FIG. 1 taken through line 1—1 showing the orientation of parts in a first (open) position;

FIG. 1C is a fragmentary sectional view of the apparatus of FIG. 1 taken through line 1—1 showing the orientation of parts in a second (closed) position;

FIG. 2A is a side elevational view of the apparatus of FIG. 1 showing the pivoting beam rotated in a first direction;

FIG. 2B is a side elevational view of the apparatus of FIG. 2A showing the orientation of the pivoting beam after a vertical force has been applied to the opposite end portion thereof;

FIG. 3 is a top plan view (partially cut away) of the apparatus of FIG. 1 showing the orientation of the cam shaft;

DESCRIPTION OF THE PREFERRED EMBODIMENTS

Figure 4:
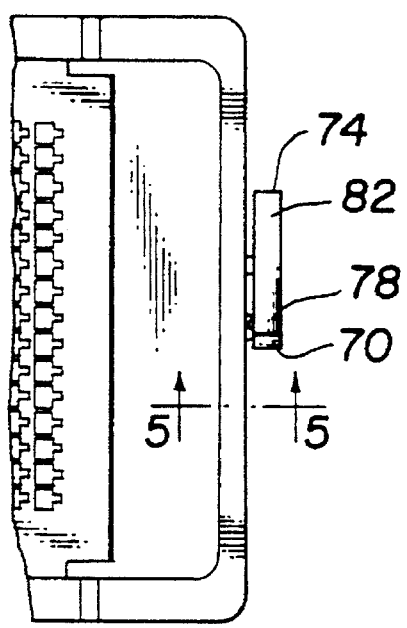
FIG. 4 is a top plan view of an alternative embodiment of the invention.

A burn-in socket employing one embodiment of the invention is illustrated in FIG. 1 and generally designated by the numeral 10. The socket 10 has a housing 14 having a top face 18 with a plurality of windows 22 therein. As shown in Fig. 1B, the windows 22 are arranged in the top face 18 to receive the terminals 26 depending from the face of an electronic device package 30. The socket 10 includes a base member 34 in which a plurality of resilient, elongated contact fingers 38 are anchored. One end of each contact finger 38 extends through the base 34 to provide an attachment tail 42 which may be soldered to a burn-in board or the like. The opposite end 46 of each finger 38 (between the free end 48 and the base 34) extends through an aperture 50 in a cam plate 54 mounted between the base 34 and the top face 18. The cam plate 54 is moveable laterally with respect to the base member 34 to bias the contact fingers 38 between an open position and a closed position. The fingers 38 are mounted so that in the open configuration the free end portions 48 are adjacent one side of their respective windows 22. FIG. 1C illustrates the closed position with free ends 48 contacting terminals 26.

In the embodiment illustrated, the electronic device package 30 has a plurality of downwardly depending terminals 26 arranged in a grid pattern and is generally referred to as a pin grid array. Similar packages employ downwardly depending terminal balls instead of pins and are referred to as ball grid array devices. This socket arrangement of this invention is applicable to ball grid array packages and pin grid array devices.

In the embodiment shown in FIGS. 1B, 1C and 3 a shaft 90 is journaled in and extends through housing 14 parallel with cam plate 54. A lobe 94 extending from shaft 90 contacts cam plate 54 to urge cam plate 54 in a first direction (away from shaft 90) when shaft 90 is rotated in a first direction and permits cam plate 54 to return to its original position when the lobe 94 is rotated away from the cam plate. Cam plate 54 may be urged to return to its original position by the resilient force of fingers 38 extending therethrough or by biasing means such as a spring or the like positioned between the housing 14 and the opposite end of cam plate 54.

As illustrated in FIGS. 1, 2A and 2B a beam 62 is secured by means of a screw 66 or the like to one end of shaft 92 extending from housing 14. The beam 62 is suspended substantially horizontally so that application of force to the top surface of either end portion thereof causes rotation of shaft 90. The beam 62 defines a first bearing surface 78 located near the first end 70 and a second bearing surface 82 located near the second end 74. The beam 62 is rotatable about the axis of shaft 90 between a first position (shown in FIG. 2A) and a second position (shown in Fig. 2B). In the first position the first bearing surface 78 is oriented to respond to a downward, substantially vertical force 86. In the second position, the second bearing surface 82 is oriented to respond to a downward, substantially vertical force 86. Vertical force may thus be alternately applied to surface 78 or 82 to open or close the socket as desired.

operation of the above-described embodiment is illustrated in FIGS. 1B, 1C, 2A and 2B. FIG. 2A shows the beam 62 oriented in the first position with the first end 70 inclined above the second end 74. The corresponding first position of the shaft 90, with the lobe 94 facing up, is shown in Fig. 1B. With the shaft 90 thus oriented, the cam plate 54 does not contact the resilient fingers 38 and the socket 10 is open to receive the terminals 26 of an electronic device package 30.

When a force 86 is applied to the first bearing surface 78 (as shown in FIG. 2A), the beam 62 rotates to the second position where the second end 74 is above the first end 70 (as shown in FIG. 2B). The corresponding orientation of the shaft 90, with lobe 94 horizontal, is shown in FIG. 1C. With the shaft 90 thus oriented, the lobe 94 engages and urges the cam plate 54 to move laterally into the resilient fingers 38. The cam plate 54 thus biases the free ends 48 of the fingers 38 into the closed position against the terminals 26 depending from the electronic device package 30. To open the socket 10 a downward, substantially vertical force 86 is applied to the second bearing surface 82 as shown in FIG. 2B.

Figure 5A:
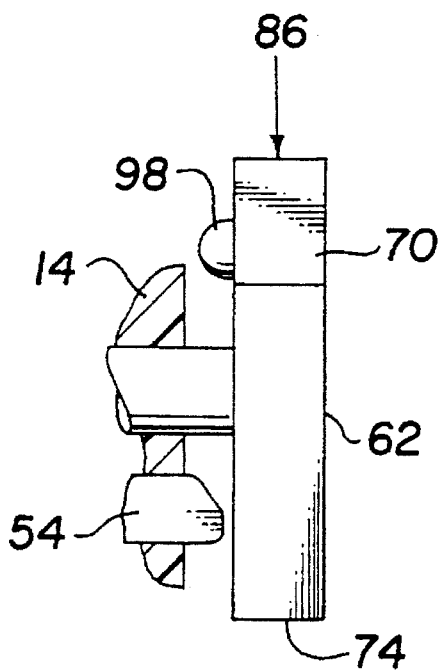
FIG. 5A is a fragmentary sectional view of the apparatus of FIG. 4 taken along lines 5—5 and showing the orientation of parts in a first (open) position.
Figure 5B:
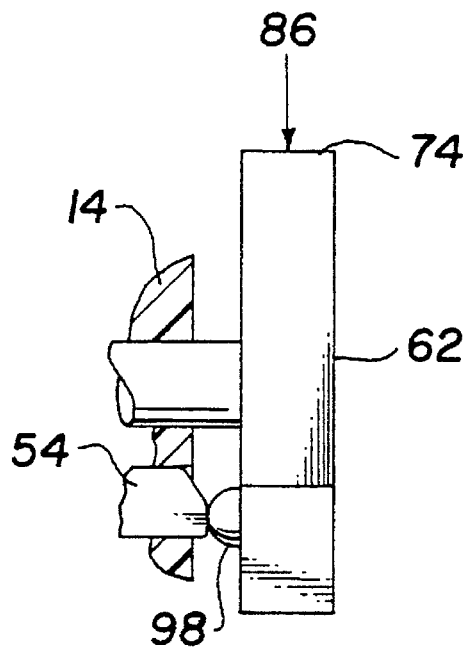
FIG. 5B is a fragmentary sectional view of the apparatus of FIG. 4 showing the orientation of parts in a second (closed) position.

An alternate embodiment of the invention is illustrated in FIGS. 4, 5A and 5B. A cam ramp 98 extends laterally from the beam 62 toward the housing 14. The cam plate 54 extends outside the envelope of the housing 14 toward the beam 62 a sufficient distance to be engaged by the cam ramp 98 as it moves between the first and second positions.

As illustrated FIGS. 5A and 5B, a downward, substantially vertical force 86 applied to the top face of the first end 70 the first end 70 rotates the first end 70 downward and the cam ramp 98 contacts the cam plate 54 to urge it laterally. The cam plate 54 biases the resilient fingers 38 into the closed position against the terminals 26 on the electronic device package 30 in the same manner as described above. To open the socket vertical force 86 is applied to the top face of the second end 74.

Figure 6:
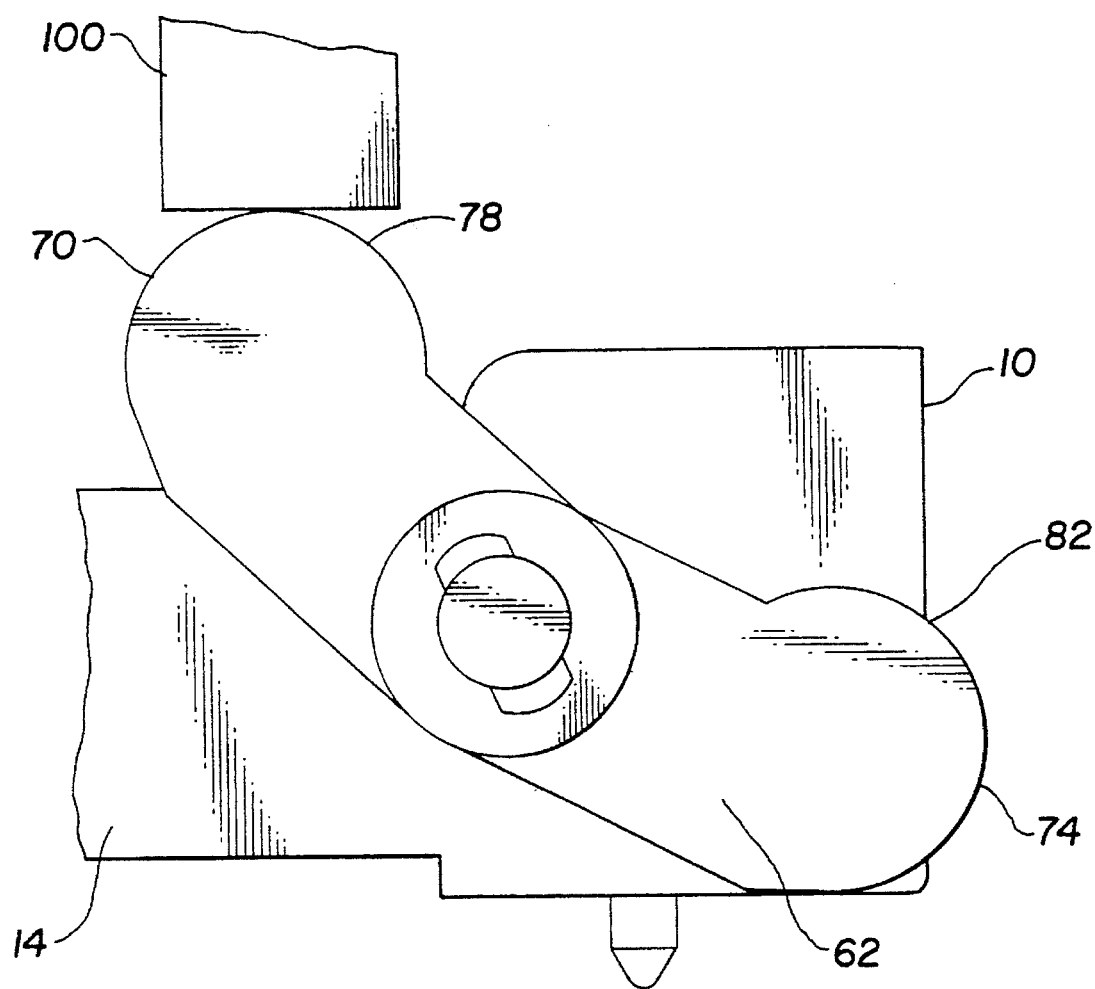
FIG. 6 is a fragmentary side elevational view of the apparatus in FIG. 1 using a beam with rounded ends.

The geometry of beam 62 may be varied as desired to accommodate the shape of the implement 100 used to exert the downward vertical force 86 as illustrated in FIG. 6 the ends 70 and 74 and bearing surfaces 78 and 82 rounded to ensure that they remain in contact with the bottom of implement 100 while the beam 62 is rotating. It is to be understood that the geometry of beam 62 may be varied in any number of ways to accommodate various shapes of implement 100. Consequently, the term "bearing surface" as used herein includes flat surfaces, rounded surfaces and any other geometry chosen to interact with an implement 100 of a particular shape.

It will be readily recognized that only relative movement between the contact fingers and the terminals is necessary to create mechanical and electrical contact therebetween. Thus the cam movement discussed hereinabove may be the result of a cam plate moving the contact fingers or a cam plate moving the device package. It will be appreciated that rotation of the beam 62 to move a cam simultaneously opens or closes a plurality of contact fingers. Normally, force applied by each contact finger to a terminal 26 should be about one (1) ounce. Accordingly, if the device package 32 has one thousand or more terminals, the collective force required to open (or closes) the socket can exceed sixty-two 62) pounds. Because of the unique design of the sockets, however, no more than the contacting force (approximately one ounce) is applied to any contact or any other position of the device package. Instead, the reactive forces for each finger are confined within the socket housing and not transmitted to either the supporting board or the electronic device package 30.

From the foregoing it will be apparent that the present invention provides a needed solution to the problem of providing an easily automated means for opening and closing the contacts in mounting apparatus employing the action of laterally moving cam plates. Although the invention has been described in detail with reference to preferred embodiments thereof, it will be understood that various changes, substitutions and alterations may be made therein without departing from the spirit and scope of the invention as defined by the appended claims.

What is claimed:

1. In apparatus having a housing and a top face for supporting an electronic device package with a plurality of downwardly depending terminals positioned in windows in said top face, a plurality of resilient elongated contact fingers with free ends for contacting said terminals and a plate adapted for lateral movement to urge the terminals and the free ends together to form electrical contact therebetween, the improvement comprising:

(a) a beam rotatable between a first position and a second position pivotally attached to said housing substantially parallel with said top surface, said beam having a first end portion and a second end portion disposed on opposite sides of a transverse axis, a first bearing surface on said first end portion oriented to react to a substantially vertical downward force when said beam is in a first position and a second bearing surface on said second end portion oriented to react to a substantially vertical downward force when said beam is in a second position; and (b) a cam responsive to movement of said beam operatively associated with the plate adapted for lateral movement to urge the terminals into contact with the elongated fingers.

2. The improvement defined in claim 1 wherein said cam is a rotatable cam shaft affixed to said beam.

3. The improvement defined in claim 1 wherein said cam is a ramp extending laterally from said pivoting beam toward said plate.

4. The improvement defined in claim 1 wherein said plate engages resilient fingers and biases them into the terminals.

5. The improvement defined in claim 1 wherein the said plate urges the terminals depending from the electronic device package into electrical contact with the contact fingers.

6. The improvement as defined in claim 1 wherein said terminals extend through the top face of the mounting apparatus.

7. The improvement as defined in claim 1 wherein said free ends of said contact fingers extend into said windows.

8. The improvement defined in claim 1 wherein said downwardly depending terminals are substantially spherical.

* * * * *